(12) United States Patent
Haba

(10) Patent No.: US 7,911,805 B2
(45) Date of Patent: Mar. 22, 2011

(54) MULTILAYER WIRING ELEMENT HAVING PIN INTERFACE

(75) Inventor: Belgacem Haba, Saratoga, CA (US)

(73) Assignee: Tessera, Inc., San Jose, CA (US)

( * ) Notice: Subject to any disclaimer, the term of this patent is extended or adjusted under 35 U.S.C. 154(b) by 712 days.

(21) Appl. No.: 11/824,484

(22) Filed: Jun. 29, 2007

(65) Prior Publication Data

US 2009/0002964 A1      Jan. 1, 2009

(51) Int. Cl.
*H01R 12/16* (2006.01)
(52) U.S. Cl. ........ 361/791; 361/760; 361/772; 361/774; 361/777; 174/261; 174/262; 29/840; 29/852
(58) Field of Classification Search .......... 361/772–774, 361/760, 762, 764, 765, 767, 776, 777, 790, 361/791, 795, 728, 729, 735, 736, 748–751; 174/262, 260, 261, 267, 255, 250, 257, 259; 29/830, 852, 840, 846, 847; 438/106, 612–614
See application file for complete search history.

(56) References Cited

U.S. PATENT DOCUMENTS

| 7,317,249 | B2 * | 1/2008 | Crisp et al. ............ 257/723 |
| 2003/0173111 | A1 * | 9/2003 | Frutschy et al. ............ 174/260 |
| 2004/0118602 | A1 * | 6/2004 | Lee et al. ............ 174/260 |
| 2006/0012967 | A1 * | 1/2006 | Asai et al. ............ 361/764 |

FOREIGN PATENT DOCUMENTS

| JP | 59-178752 A | 10/1984 |
| JP | 59-198747 A | 11/1984 |
| JP | 1-308057 A | 12/1989 |

OTHER PUBLICATIONS

International Search Report issued on Oct. 6, 2008 in connection with corresponding International Appln. No. PCT/US2008/007978.

* cited by examiner

*Primary Examiner* — Dameon E Levi
*Assistant Examiner* — Hoa C Nguyen
(74) *Attorney, Agent, or Firm* — Lerner, David, Littenberg, Krumholz & Mentlik, LLP

(57) ABSTRACT

A method of forming contacts for an interconnection element, includes (a) joining a conductive element to an interconnection element having multiple wiring layers, (b) patterning the conductive element to form conductive pins, and (c) electrically interconnecting the conductive pins with conductive features of the interconnection element. A multiple wiring layer interconnection element having an exposed pin interface, includes an interconnection element having multiple wiring layers separated by at least one dielectric layer, the wiring layers including a plurality of conductive features exposed at a first face of the interconnection element, a plurality of conductive pins protruding in a direction away from the first face, and metal features electrically interconnecting the conductive features with the conductive pins.

36 Claims, 6 Drawing Sheets

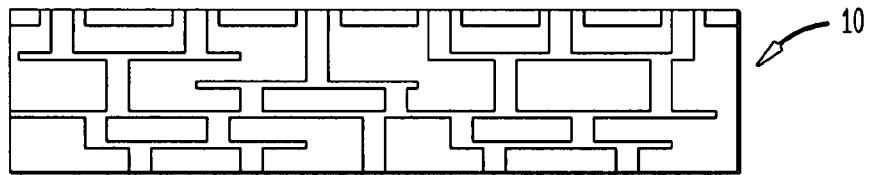
FIG. 2A
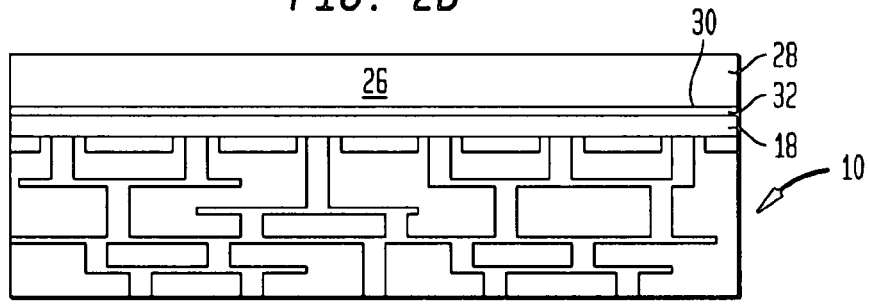
FIG. 2B
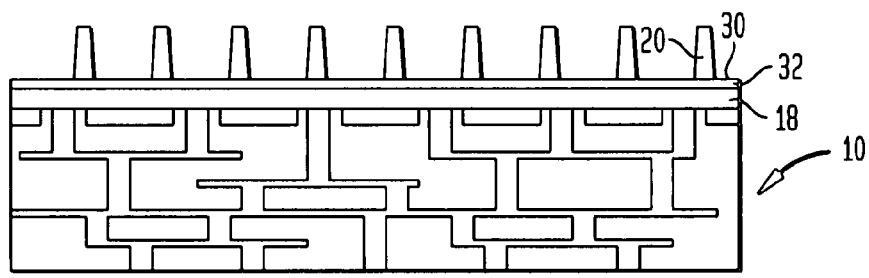
FIG. 2C
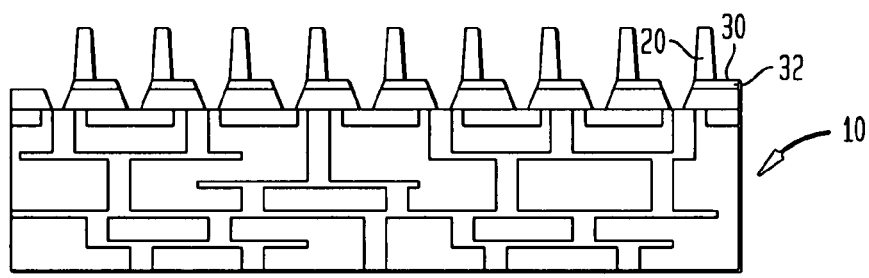
FIG. 2D
FIG. 2E
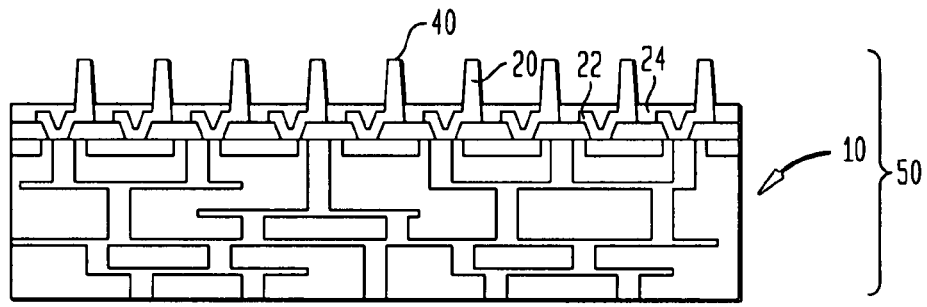

MULTILAYER WIRING ELEMENT HAVING PIN INTERFACE

BACKGROUND OF THE INVENTION

The present invention relates generally to interconnecting microelectronic devices and supporting interconnection elements, especially multilayer wiring elements.

In the flip-chip mounting technique, the front or contact-bearing surface of a microelectronic device is mounted face-down to an interconnection element such as a chip carrier or other interconnection element, e.g., substrate. Each contact on the device is joined by a solder bond to the corresponding contact pad on the substrate, as by positioning solder balls on the substrate or device, juxtaposing the device with the substrate in the front-face-down orientation and momentarily reflowing the solder. The flip-chip technique yields a compact assembly, which occupies an area of the substrate no larger than the area of the chip itself.

However, thermal stress presents significant challenges to the design of flip-chip assemblies. The solder bonds between the device contacts and the supporting substrate are substantially rigid. Changes in the relative sizes of the device and the supporting substrate due to thermal expansion and contraction in service create substantial stresses in these rigid bonds, which in turn can lead to fatigue failure of the bonds. Moreover, it is difficult to test the chip before attaching it to the substrate, and hence difficult to maintain the required outgoing quality level in the finished assembly, particularly where the assembly includes numerous chips.

As the number of interconnections per microelectronic device increases, the issue of interconnection planarity continues to grow as well. If the interconnections are not planar with respect to each other, it is likely that many of the interconnections will not electrically contact their juxtaposed contact pads on a supporting substrate, such as a standard printed wiring board. Therefore, a method of making coplanar pins on existing multilayer interconnection elements is desired.

SUMMARY OF THE INVENTION

In an embodiment of the present invention, a method of forming contacts for an interconnection element, includes (a) joining a conductive element to an interconnection element having multiple wiring layers, (b) patterning the conductive element to form conductive pins, and (c) electrically interconnecting the conductive pins with conductive features of the interconnection element.

In another embodiment of the present invention, a multiple wiring layer interconnection element having an exposed pin interface, includes an interconnection element having multiple wiring layers separated by at least one dielectric layer, the wiring layers including a plurality of conductive features exposed at a first face of the interconnection element, a plurality of conductive pins protruding in a direction away from the first face, and metal features electrically interconnecting the conductive features with the conductive pins.

BRIEF DESCRIPTION OF THE DRAWINGS

FIGS. 2A-2E illustrate another embodiment of a method of assembling an electronic interconnect of the present invention.

DETAILED DESCRIPTION

A method of making coplanar pins on existing multilayer interconnection elements is herein described. A multilayer interconnection element 10 is shown in FIG. 1, having dielectric portions 12 and conductive portions 14. The conductive portions may be in the form of wires, bond pads or the like.

The multilayer interconnection element 10 may be formed of a single metal substrate or a multilayer substrate with dielectric such as polyimide, ceramic, FR4, BT resin and the like. The multilayer interconnection element 10 may also be an interconnection element with multiple wiring layers or the like. Reference is also made to U.S. Pat. No. 6,528,784 which discusses the manufacture of a multilayer interconnection element, which is hereby incorporated by reference.

Figure 1A:
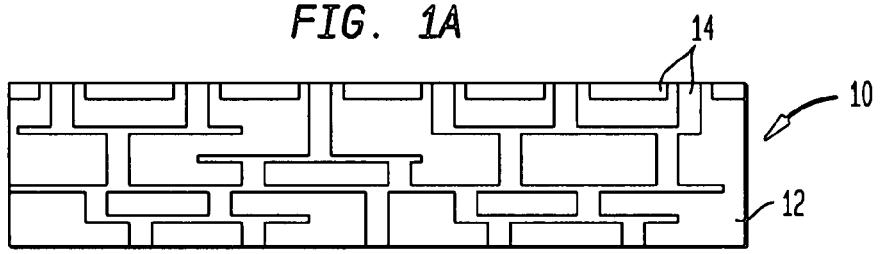
FIGS. 1A-1E illustrate an embodiment of a method of assembling an electronic interconnect of the present invention.
Figure 1B:
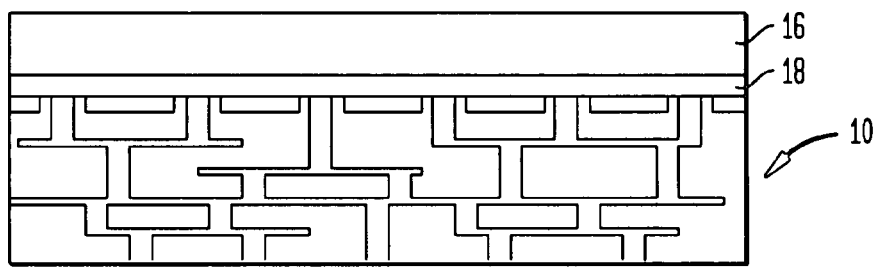
Figure 1C:
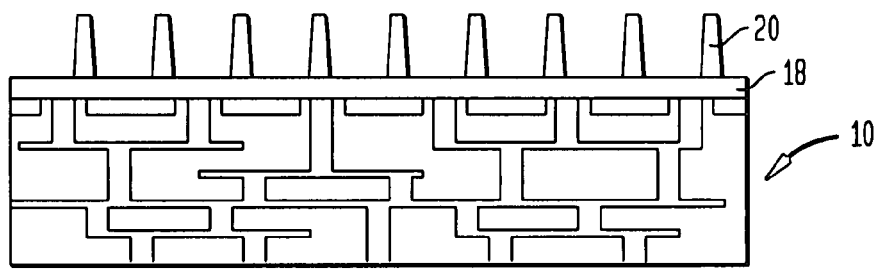

In one embodiment of the present invention, a metallic layer 16 is laminated onto the multilayer interconnection element 10 using an adhesive 18 as illustrated in FIG. 1B. The metallic layer 16 may be any suitable metal as known in the art. For example, the metal may be any conductive metal, such as copper. Thereafter, the metallic layer 16 may be used to form microelectronic contacts or pins 20 as shown in FIG. 1C.

The microelectronic pins 20 may be formed as known in the art. For example, the microelectronic pins 20 may be formed by photolithographically patterning a resist layer on metallic layer 16 and transferring the resist patterns to the metallic layer 16 by etching.

Figure 1D:
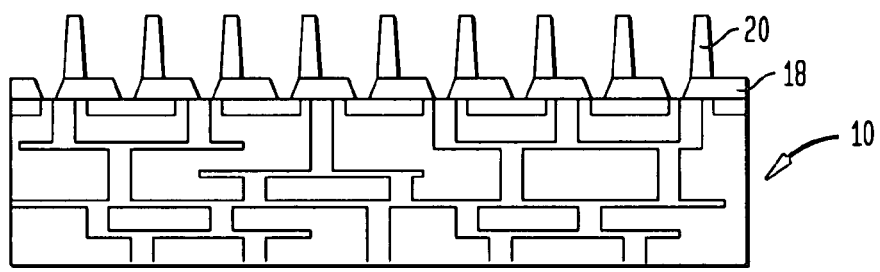

Once the microelectronic pins 20 are formed, where the adhesive layer 18 acts as an etch stop layer, the adhesive 18 may have portions removed from it to permit electrical connections to be formed between the microelectronic pins 20 and the conductive portions 14 of the multilayer interconnection element 10, as shown in FIG. 1D. The adhesive 18 may be selectively removed using photolithographic techniques or the like, as known in the art.

Figure 1E:
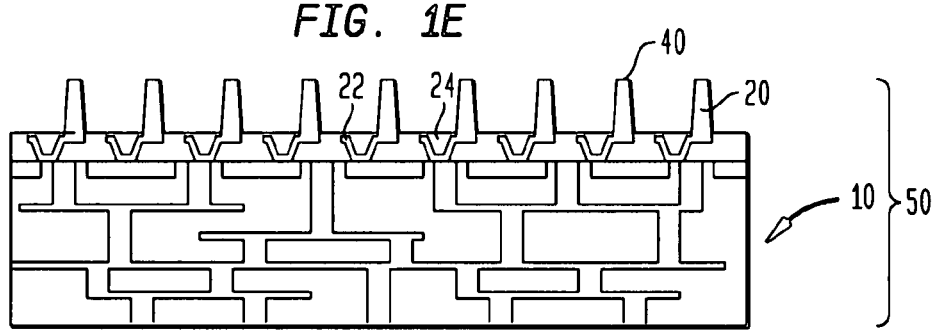

Then, as shown in FIG. 1E, electrical connections 22 are formed adjacent the portions removed from the adhesive 18. For example, sputtering, also known as physical vapor deposition, or electroless plating may be followed by photolithographic patterning or laser drilling to define locations of the connections. Once the electrical connections 22 have been formed, they may be electroplated to increase their thickness to an amount desired. This then results in electrical connections 22 being formed between the multilayer interconnection element 10 and the microelectronic pins 20. Lastly, a protective dielectric layer or film 24 (FIG. 1E) may be deposited onto the multilayer interconnection element 10 covering the electrical connections 22 and lower portions of the microelectronic pins 20 to form the assembly 50 is not damaged. This protective layer 24 can also assist in maintaining co-planarity of the top surfaces 40 of the microelectronic pins 20 because the dielectric protective layer 24 reduces flexure when the assembly 50 is handled because it holds the pins 20 in a stiff fashion. Example protective layer materials include a solder mask or the like.

In another embodiment of the present invention, a multilayer interconnection element 10 is illustrated as shown in FIG. 2A. Thereafter, as shown in FIG. 2B, a layered metallic structure 26 is joined to the multilayer interconnection element 10 using an adhesive 18. The layered metallic structure 26 may include a first metallic layer 28, an etch stop layer 30 and a second metallic layer 32. The first metallic layer 28, preferably, has a greater thickness than the second metallic layer 32. Although a trimetal structure is illustrated, the layered metallic structure 26 may include any number of layers.

Microelectronic pins 20 may be formed from the first metallic layer 28, as shown in FIG. 2C using techniques such as photolithographic patterning, or the like. However, the etch-stop layer remains.

Figure 3:
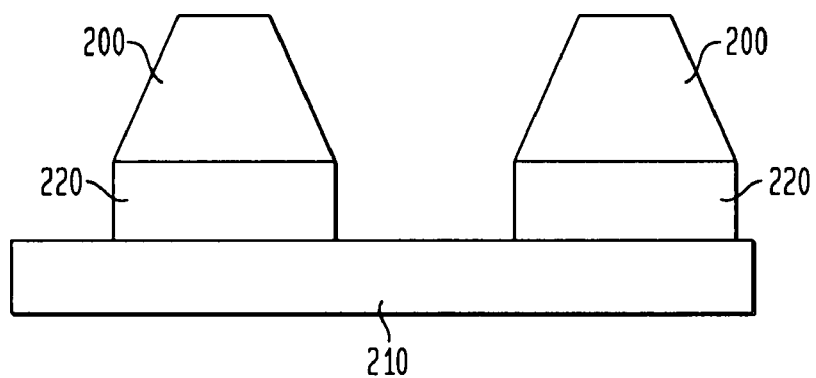
FIG. 3 schematically illustrates a side view of microelectronic pins.

A method of fabricating the pins 20 will now be described with reference to the following figures. As shown in FIG. 3, a plurality of conductive pins 200 are formed to protrude above a surface of a continuous metal wiring layer 210. The pins 200 can be formed by a variety of different processes. Exemplary processes are described in U.S. Pat. No. 6,884,709, as well as in the U.S. Provisional Application entitled, "Chip Capacitor Embedded PWB" having Ser. No. 60/875,730 and a file date of Jan. 11, 2007, the disclosures of which are incorporated by reference herein.

In one such process, an exposed metal layer of a multi-layer metal structure is etched in accordance with a photolithographically patterned photoresist layer to form pins 200, the etching process stopping on an interior metal layer 220 of the structure. The interior metal layer 220 includes one or more metals different from that of the exposed metal layer, the interior metal layer 220 being of such composition that it is not attacked by the etchant used to etch the exposed metal layer. For example, the metal layer from which the pins 200 are etched can consist essentially of copper, the continuous metal layer 210 can also consist essentially of copper, and the interior metal layer 220 can consist essentially of nickel. Nickel provides good selectivity relative to copper to avoid the nickel layer from being attacked when the metal layer is etched to form pins 200.

After forming the pins 200, a different etchant is then applied to remove the exposed interior metal layer 220 by a process which is selective to the underlying metal layer 210. Alternatively, another way that the pins 200 can be formed is by electroplating, in which pins are formed by plating a metal onto a base metal layer 210 through openings patterned in a dielectric layer such as a photoresist layer.

Figure 4:
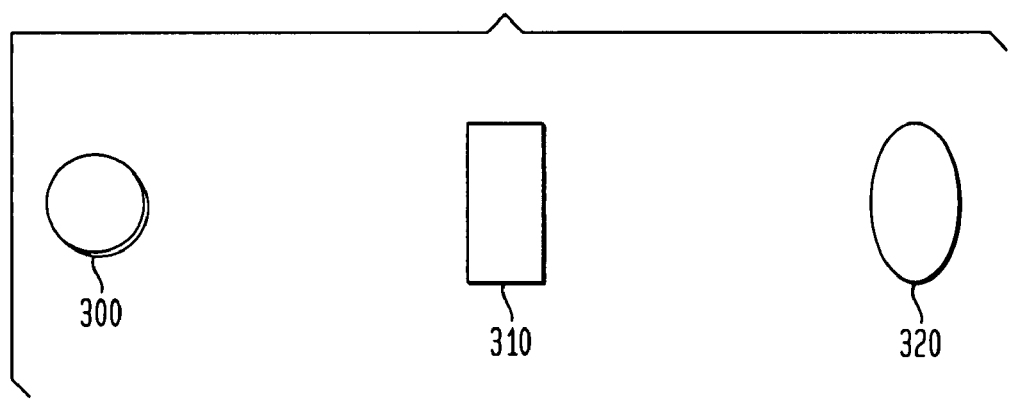
FIG. 4 schematically illustrates a top view of microelectronic pins.

As indicated in plan view in FIG. 4, the pins can have a variety of different shapes and sizes. For example, when viewed from the top, the pins can have a shape which is circular 300, square or rectangular 310, or oval shape 320. When pins have a star shape, it may allow them to compress more easily or less easily than when other shapes are used. The height of the pins 200 above the plane of the underlying metal layer typically ranges between about 15 microns (μm) and about 250 microns (μm) and the width ranges for the tip of the pins is about 30 microns and above.

Figure 5A:
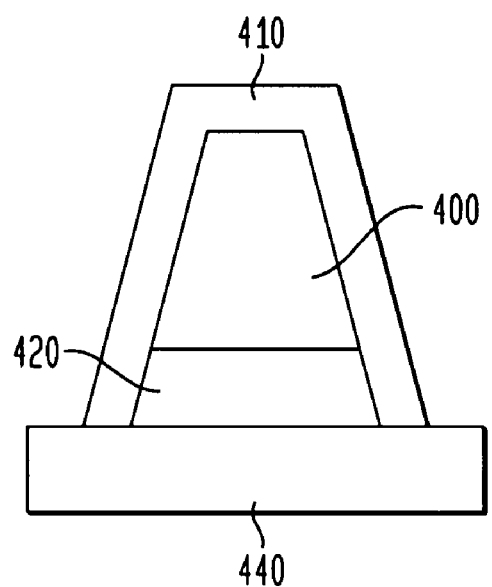
FIGS. 5A-5B schematically illustrate a side view of microelectronic pins.
Figure 5B:
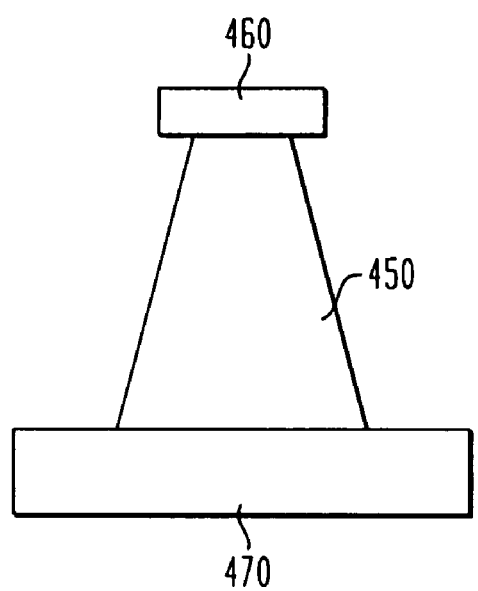

FIGS. 5A and 5B illustrate exemplary alternative structures that the pins can take. For example, as illustrated in FIG. 5A, a pin 400 is formed by etching a first metal layer selective to an etch stop metal layer 420 which overlies a base metal layer 440, the pin 400 being coated with a second metal layer 410. The second metal layer can include the same metal as the first metal layer, one or more other metals, or a combination of a metal included in the first metal layer with another metal. In a particular embodiment, the second metal layer 410 includes a metal such as gold which is resistant to corrosion and which may also facilitate the formation of a diffusion bond between the second metal layer and a metal layer of another feature in contact therewith. In another particular embodiment, the second metal layer includes a low melting temperature metal such as tin or a low melting temperature metal alloy such as solder or a eutectic composition. Additional examples of one or more metals usable as a second metal layer include nickel, aluminum or nickel/gold.

As illustrated in FIG. 5B, only the tip of a conductive pin 450 may be coated with a second metal layer 460, and the body of the conductive pin may contact the adhesive layer 470 directly, without an intervening etch stop layer.

Thereafter, as shown in FIG. 2D, portions of the etch stop layer 30, the second metallic layer 32 and the adhesive 18 may be removed. The etch stop layer 30, the second metallic layer 32 and the adhesive 18 may be removed either simultaneously or sequentially, as desired. Removal of these layers permits electrically connecting the microelectronic pins 20 with the conductive portions 14 of the multilayer interconnection element 10, as stated herein. Lastly, a protective dielectric layer 24 such as described above (FIG. 1E) may then be deposited atop the completed structure.

Figure 6A:
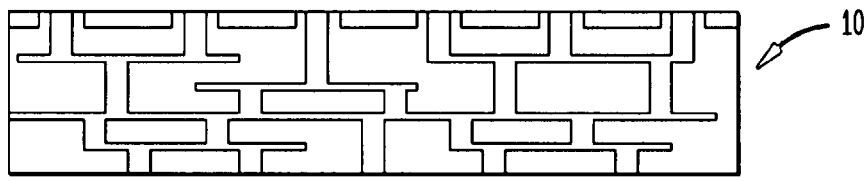
FIGS. 6A-6E illustrate another embodiment of a method of assembling an electronic interconnect of the present invention.
Figure 6B:
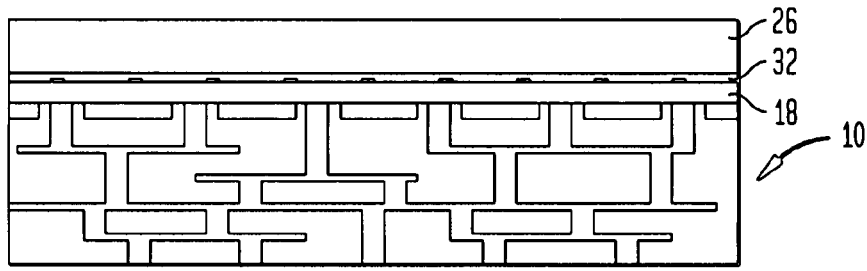
Figure 6C:
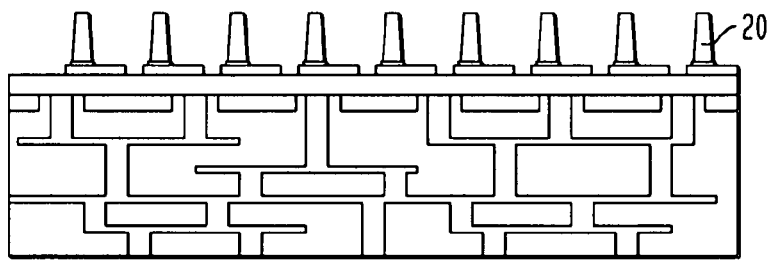

In yet another embodiment of the present invention, as illustrated in FIGS. 6A-6E a layered metallic structure 26 may be joined to a multilayer interconnection element 10 using an adhesive 18. However, prior to this step, the second metallic layer 32 has portions removed therefrom, such that when the layered metallic structure 26 is attached to the multilayer interconnection element 10 using the adhesive, some of the adhesive may then rise into the removed portions of the second metallic layer 32, as shown in FIGS. 6B and 6C. Thus, the second metallic layer 32 may already be patterned prior to affixing the layered metallic structure 26 to the multilayer interconnection element 10.

Figure 6D:
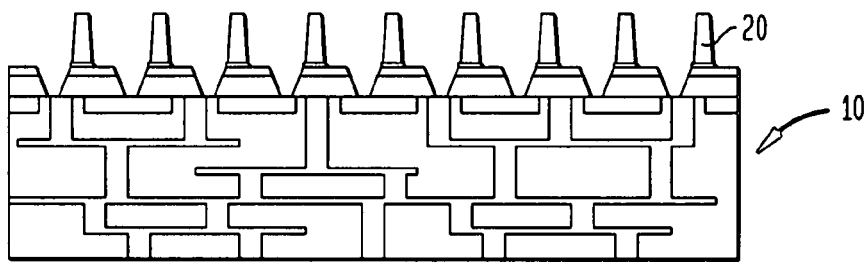
Figure 6E:
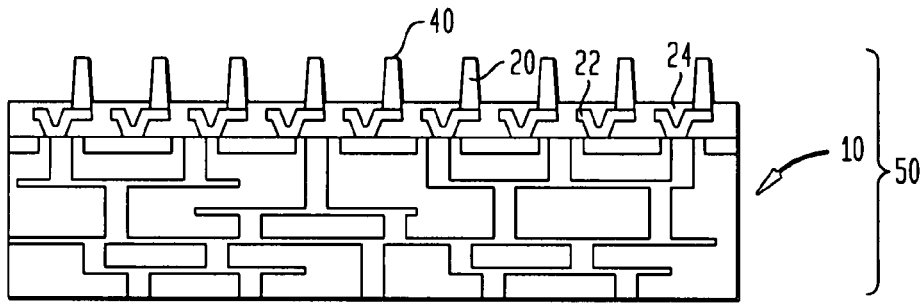

Thereafter, microelectronic pins 20 are formed in a manner as stated previously. Next, portions of the etch stop layer 30 and the adhesive 18 are removed as shown in FIG. 6D. Then, electrical connections 22 are formed which electrically connect the microelectronic pins 20 with the conductive portions 14 of the multilayer interconnection element 10. Lastly, a protective layer 24 may be deposited to form the assembly 50.

Figure 7A:
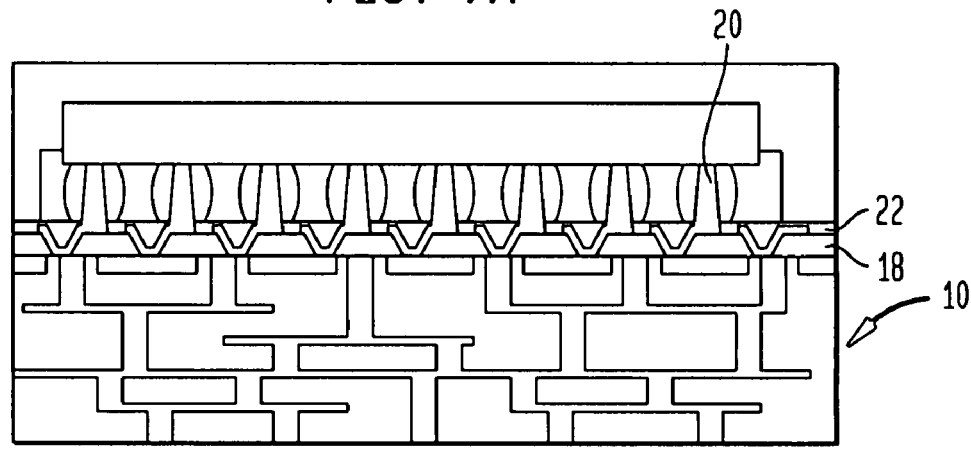
FIGS. 7A-7C illustrate an embodiment of an assembly of the invention joined to other electronic structures.
Figure 7B:
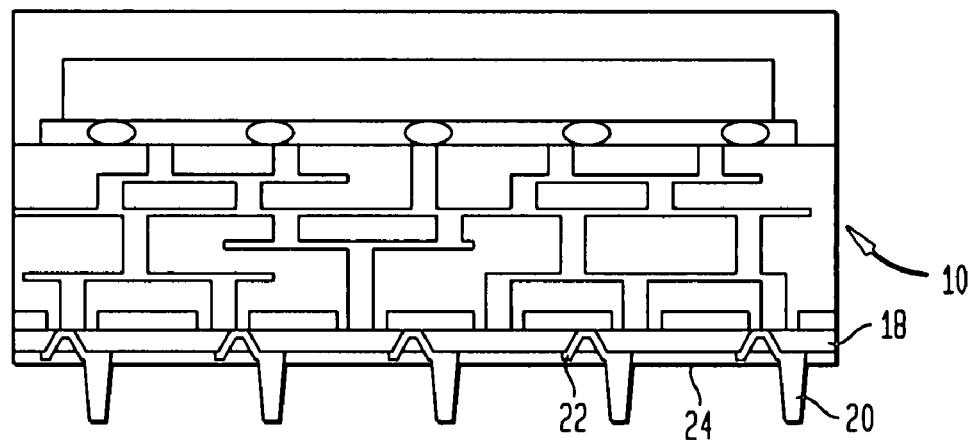
Figure 7C:
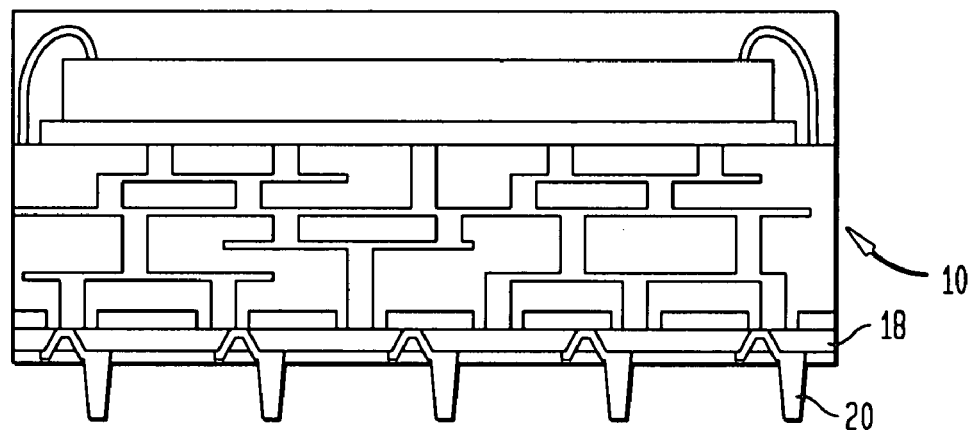

The methods and structures described herein are advantageous for flip-chip mounting of a chip, having a land grid array ("LGA") or ball grid array ("BGA"), to the exposed pin interface such as that shown in FIG. 7A. A chip may also be mounted to the assembly 50 on a side opposite the microelectronic pins 20, as shown in FIG. 7B. Further, the methods and structures are also advantageous for flip chip or wire bond microcontacts as shown in FIG. 7C. The finished assembly may be a circuit panel or may be a circuit panel joined to a chip. Further, the finished assembly may be meant for interconnection to another circuit panel or a chip.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A multiple wiring layer interconnection element having an exposed pin interface, comprising:
   an interconnection element having multiple wiring layers separated by at least one dielectric layer, the wiring layers including a plurality of conductive features exposed at a first face of the interconnection element; and at least one of a dielectric layer or one or more second features exposed at a second face of the interconnection element remote from the first face;

a plurality of substantially rigid conductive pins protruding in a direction away from the first face to a height above the first face, the pins made of metal having a melting point substantially higher than a melting point of a joining metal such that the pins are adapted to remain solid during a joining process; and metal features electrically interconnecting the conductive features with the conductive pins.

2. The element of claim 1, wherein the interconnection element is joined to the conductive pins with an adhesive.

3. The element of claim 2, wherein the adhesive includes openings through which the metal features extend.

4. The element of claim 1, wherein the conductive pins are formed from a layered metal structure having an outer metal layer, an inner metal layer facing the interconnection element and a third metal layer between the inner and outer metal layers.

5. The element of claim 4, wherein conductive pins are formed from the outer metal layer.

6. The element of claim 4, wherein the metal features interconnect the conductive features with portions of the inner metal layer.

7. An assembly including the element of claim 1, further comprising a microelectronic element having contacts juxtaposed with and joined to the conductive pins.

8. An assembly including the element of claim 1, further comprising a microelectronic element having contacts interconnected with the conductive features of the interconnecting element.

9. The assembly of claim 8, wherein the conductive features are at a second face remote from the conductive pins.

10. An interconnection element, comprising:

a multilayer substrate having a plurality of conductive pads, the multilayer substrate having multiple wiring layers separated by at least one dielectric layer, the wiring layers including a plurality of conductive features exposed at a first face of the multilayer substrate; and at least one of a dielectric layer or one or more second features exposed at a second face of the multilayer substrate remote from the first face;

a plurality of substantially rigid conductive posts protruding in a direction away from the first face to a height above the first face, the posts made of metal having a melting point substantially higher than a melting point of a joining metal such that the posts are adapted to remain solid during a joining process;

a joining layer positioned between the multilayer substrate and the plurality of posts, the joining layer having first and second surfaces and a plurality of metallized vias extending between the first and second surfaces, the plurality of metallized vias are positioned to electrically couple the plurality of posts to the plurality of conductive pads on the multilayer substrate.

11. The element of claim 10, wherein the posts are formed from a layered metal structure having an outer metal layer, an inner metal layer facing the joining layer and a third metal layer between the inner and outer metal layers.

12. The element of claim 11, wherein the posts are formed from the outer metal layer.

13. An assembly including the element of claim 10, further comprising a microelectronic element having contacts interconnected with the posts.

14. An assembly including the element of claim 10, further comprising a microelectronic element having contacts interconnected with second conductive pads of the multilayer substrate exposed at a second face of the multilayer substrate.

15. The assembly of claim 14, wherein the second conductive pads are at the second face being remote from a first face of the multilayer substrate adjacent the joining layer.

16. The element of claim 10, wherein the joining layer is an adhesive.

17. A method of forming contacts for an interconnection element, comprising:

(a) joining a conductive element to an interconnection element having multiple wiring layers with a dielectric layer disposed between the conductive element and the interconnection element;

(b) patterning the conductive element to form conductive pins such that at least a portion of a major surface of the dielectric layer is exposed between at least some of the pins;

(c) then forming openings in the dielectric layer extending from the exposed portions of the major surface; and (d) then electrically interconnecting the conductive pins with conductive features of the interconnection element through the openings in the dielectric layer.

18. The method of claim 17, wherein step (a) includes joining the conductive element to the interconnection element with the dielectric layer.

19. The method of claim 18, wherein the dielectric layer includes an adhesive.

20. The method of claim 18, wherein step (c) includes forming electrically conductive traces extending within the openings in the dielectric layer, the traces interconnecting the conductive features with the conductive pins.

21. The method of claim 17, wherein the conductive element includes a single metal sheet.

22. The method of claim 17, wherein the conductive element includes a layered metal structure.

23. The method of claim 22, wherein the layered metal structure includes an outer metal layer, an inner metal layer facing the interconnection element and a third metal layer between the inner and outer metal layers, step (b) further includes etching the outer metal layer selectively with respect to the third metal layer, and step (c) includes interconnecting the conductive features with portions of the inner metal layer.

24. The method of claim 23, wherein step (c) further includes forming openings in the third metal layer and inner metal layer, the openings being aligned with the conductive features.

25. The method of claim 23, wherein the inner metal layer has first openings and step (c) further includes forming through openings in the third metal layer, the through openings being aligned with the first openings and the conductive features.

26. A method of forming a packaged chip including the method of forming contacts for an interconnection element as claimed in claim 17, further comprising:

(d) electrically interconnecting contacts of a microelectronic element with the conductive pins.

27. A method of forming a packaged chip including the method of forming contacts for an interconnection element as claimed in claim 17, wherein the conductive pins project from a first face of the interconnection element, the method further comprising:

(d) electrically interconnecting contacts of a microelectronic element with second conductive features of the interconnection element exposed at a second face of the interconnection element, the second face being remote from the first face.

28. The method of claim 1, wherein step (c) forms the openings having locations not wholly determined by locations of the pin relative to the dielectric layer.

29. A method of forming an interconnection element, comprising:

providing a multilayer substrate having a plurality of contact pads, the multilayer substrate including multiple wiring layers separated by at least one dielectric layer, the wiring layers including a plurality of conductive features exposed at a first face of the multilayer substrate; and at least one of a dielectric layer or one or more second features exposed at a second face of the multilayer substrate remote from the first face;

securing a metal layer to the multilayer substrate with a joining layer;

forming a plurality of substantially rigid conductive posts from the metal layer, the posts having edges defining a maximum extent of the posts in a lateral direction along the joining layer; and forming a plurality of metallized vias within the joining layer, the metallized vias electrically coupling the contact pads of the multilayer substrate with the plurality of posts, the metallized vias being disposed beyond the edges of the posts.

30. The method of claim 29, wherein the joining layer comprises a dielectric layer.

31. The method of claim 30, wherein the dielectric layer comprises an adhesive.

32. The method of claim 29, wherein the metal layer includes a single metal sheet.

33. The method of claim 29, wherein the metal layer includes a layered metal structure.

34. A method of forming a packaged chip including the method of forming contacts for an interconnection element as claimed in claim 29, further comprising:

electrically interconnecting contacts of a microelectronic element with the posts.

35. A method of forming a packaged chip including the method of forming contacts for an interconnection element as claimed in claim 29, wherein the posts project from a first face of the interconnection element, the method further comprising:

electrically interconnecting contacts of a microelectronic element with second conductive pads of the multilayer substrate exposed at a second face of the multilayer substrate, the second face being remote from the first face.

36. The method of claim 29, wherein the posts are made of metal having a melting point substantially higher than a melting point of a joining metal such that the posts are adapted to remain solid during a joining process.

\* \* \* \* \*